United States Patent [19]

Debroux

[11] Patent Number: 5,034,701
[45] Date of Patent: Jul. 23, 1991

[54] AMPLIFIER CIRCUIT WITH LINEARLY CONTROLLED GAIN

[75] Inventor: Jean-Francois Debroux, Saint Etienne de St Geoirs, France

[73] Assignee: Thomson Composants Militaires et Spatiaux, Courbevoie, France

[21] Appl. No.: 500,585

[22] Filed: Mar. 28, 1990

[30] Foreign Application Priority Data

Apr. 4, 1989 [FR] France ................. 89 04406

[51] Int. Cl.$^5$ ............................................. H03G 3/30
[52] U.S. Cl. .................................... 330/254; 330/279
[58] Field of Search ................. 330/127, 129, 85, 254, 330/278, 279, 307

[56] References Cited

U.S. PATENT DOCUMENTS

| | | | |
|---|---|---|---|
| 3,710,270 | 1/1973 | Addis et al. | 330/284 X |
| 4,523,153 | 6/1985 | Itoh | 330/254 |
| 4,574,252 | 3/1986 | Slack | 330/278 X |
| 4,736,166 | 4/1988 | Eckland et al. | 330/284 |

FOREIGN PATENT DOCUMENTS 0251530 1/1988 European Pat. Off. .
0272702 6/1988 European Pat. Off. .

*Primary Examiner*—James B. Mullins
*Attorney, Agent, or Firm*—Oblon, Spivak, McClelland, Maier & Neustadt

[57] ABSTRACT

Disclosed is an amplifier circuit with gain controlled by a current or a voltage. It is sought to obtain a linear gain as a function of the set value current or voltage, whereas amplifiers with controlled gain usually have a non-linear variation of the gain as a function of gain control voltage. According to the invention, there is proposed an amplifier circuit with the particular feature of having two identical amplifiers with controlled gain: one receives the signal to be amplified and gives an amplified output signal; the other receives a reference voltage or current and gives an output which is compared with a signal with a set value of variation in gain. The result of the comparison is used to automatically control the gain of the second amplifier to adjust its output to a desired value. The first amplifier receives the same automatic control signal as the second one. The second amplifier has its output automatically linked to a set value while, at the same time, having a fixed voltage or current as an input signal. It therefore has a known gain proportionate to the set value. Finally, the first amplifier, which is identical to the second one and receives the same gain control signal, thus has a gain proportionate to the set value, in accordance with what was desired.

8 Claims, 2 Drawing Sheets

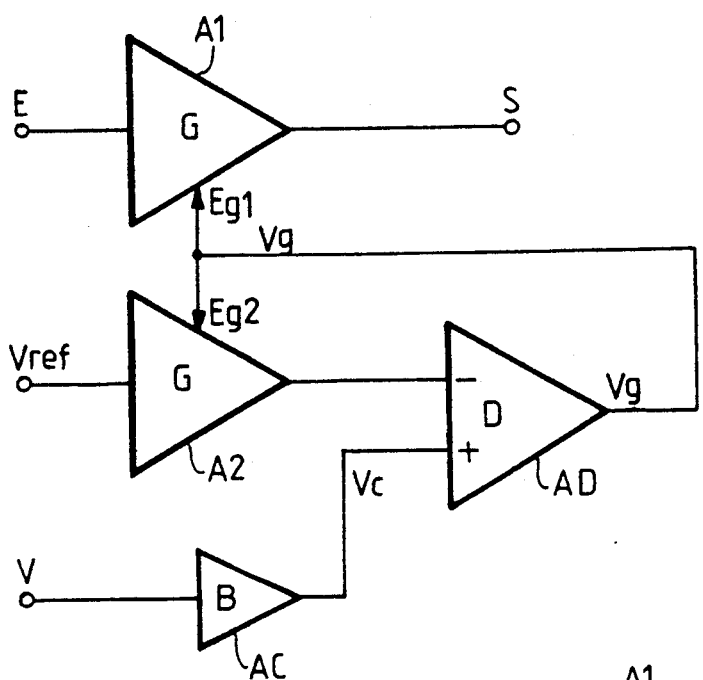
FIG_1
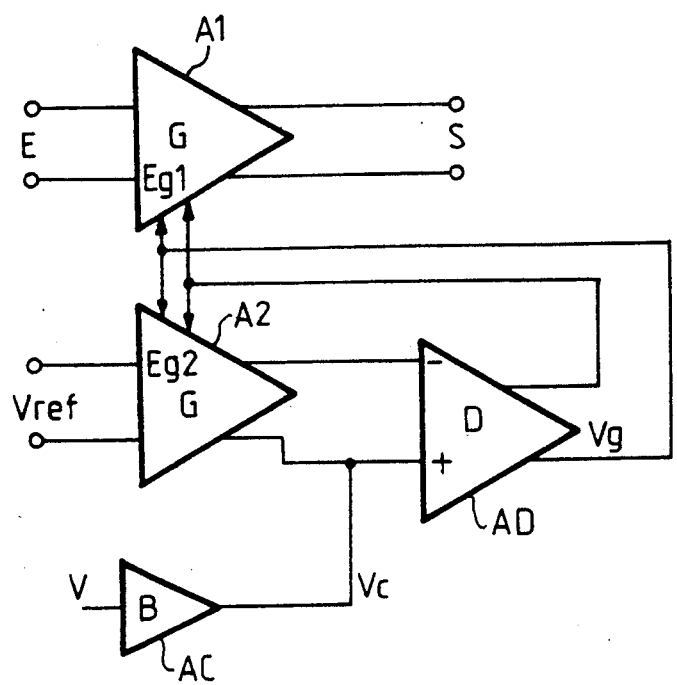
FIG_2
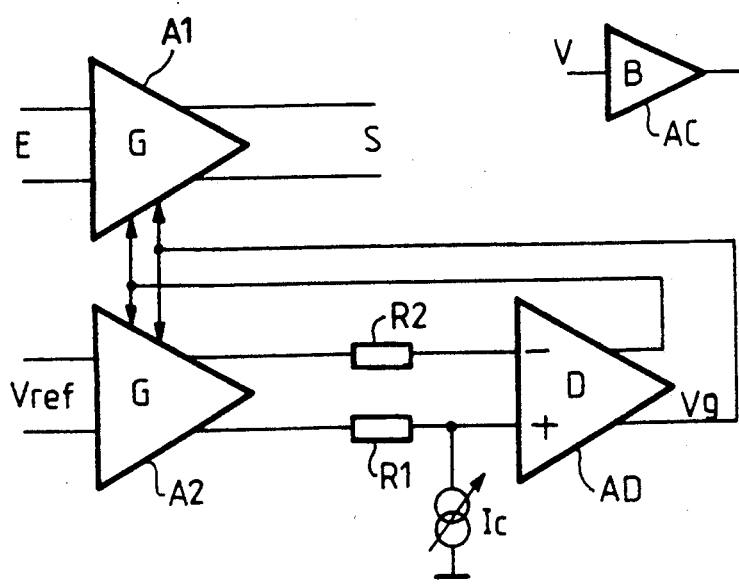
FIG_3

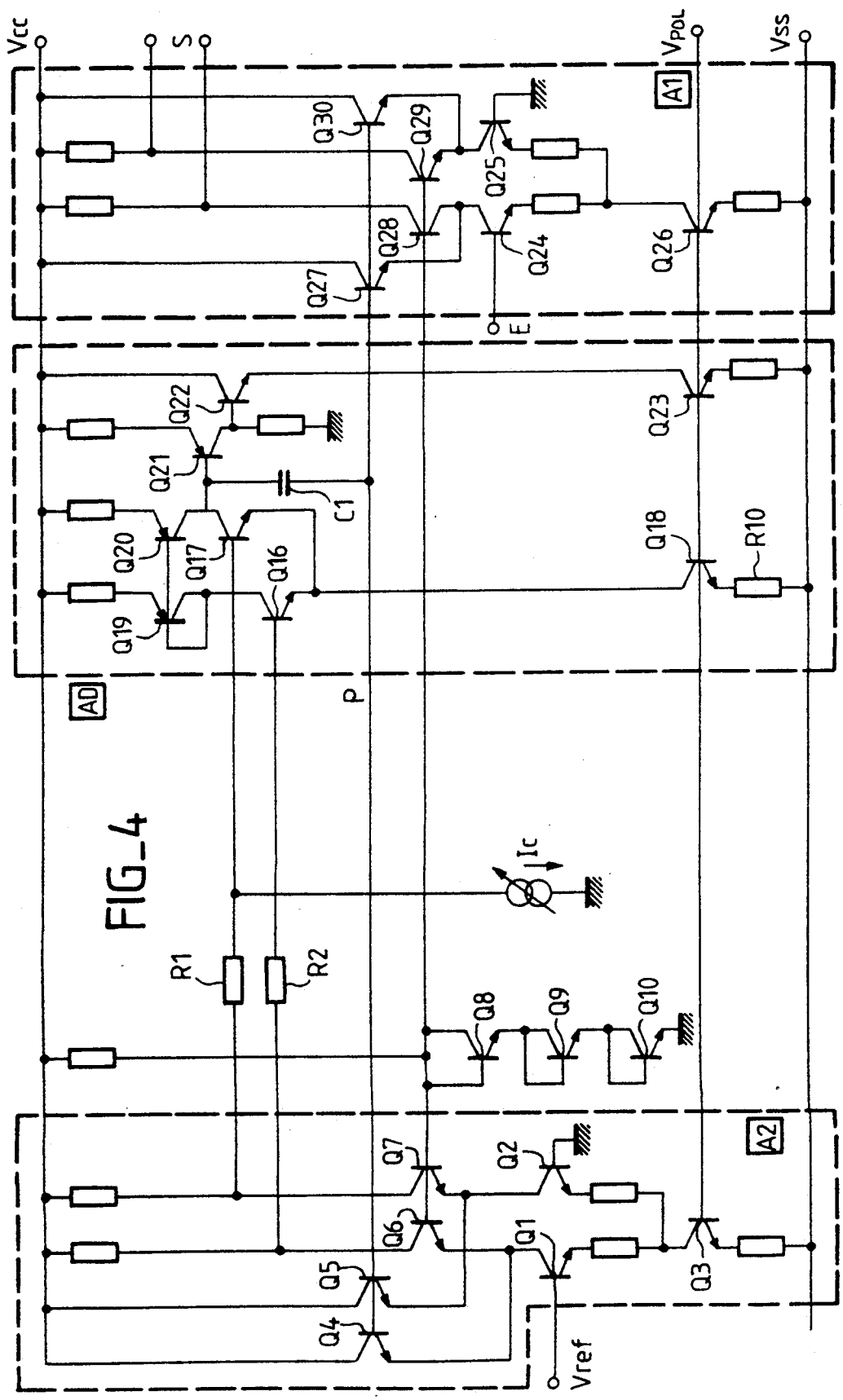
FIG_4

AMPLIFIER CIRCUIT WITH LINEARLY CONTROLLED GAIN

BACKGROUND OF THE INVENTION

1. Field of the Invention

The invention concerns a circuit for the amplification of electrical signals and, more particularly, an amplifier circuit, the gain of which can be controlled at will by an electrical variable (current or voltage).

2. Description of the Prior Art

There are known ways of making amplifiers the gain of which is controlled by a current or voltage. For example, in any transistor amplifier, if the load resistance of an output transistor is made to vary, a variation in gain is obtained. Consequently, if a transistor or a transistor in series with a resistor is used as a load, it is possible to set up a variable load resistance, controlled by an electrical signal driving the base of the transistor. Thus, a variable gain, controlled by the base of this load transistor, is obtained.

The variable gain can also be obtained by acting on the quiescent current of the amplifier or on the value of the fraction of the current applied to the load.

The problem with these controlled gain amplifiers is the absence of linearity between the gain control signal and the gain obtained. The gain is not proportionate to the voltage or the current which is used to make the gain vary. In certain applications, this is troublesome.

To make the gain proportionate to the signal that controls it, a correction circuit compensating for the non-linearity of the control generally has to be interposed between the gain control signal and the gain control input of the amplifier. But clearly, the total linearity obtained is a function of the quality of the compensation throughout the range of use, and it will be understood that it is difficult to compensate for the non-linearity of the amplifier with precision.

Furthermore, manufacturing variations have to be taken into account. Even if it were to be theoretically possible to match a correction circuit perfectly to the amplifier, the gain control of which has to be linearized, the batch production of the amplifier would inevitably lead to variations so much so that the correction of linearity would be imperfect in reality. In particular, in a manufacture in the form of monolithic integrated circuits, the manufacturing variations could be great.

The following is an example of a major application for which there is a felt need for an amplifier with precise and linear gain control: it is desired to make an amplifier having a gain that is directly proportionate to the absolute temperature (for example to make the input stage of a logarithmic gain amplifier). However, to obtain sufficient precision while, at the same time, having sufficient gain, it became necessary, in fact, to make a circuit using resistors with a known coefficient of temperature. Unfortunately, these resistors cannot be integrated into a monolithic circuit, and this is a major drawback.

Consequently, there is the felt need for an amplifier circuit with controlled gain that is linear as a function of the gain control signal and can be integrated into a monolithic circuit.

An object of the present invention is to propose a controlled gain amplifier circuit such as this.

SUMMARY OF THE INVENTION

According to the invention, there is therefore proposed an amplifier circuit with the particular feature of having two identical amplifiers with controlled gain: one receives the signal to be amplified and gives an amplified output signal; the other receives a reference voltage or current and gives an output which is compared with a signal of a set value of variation in gain. The result of the comparison is used to automatically control the gain of the second amplifier to adjust its output to a desired value. The first amplifier receives the same gain variation control signal as the second one.

Consequently, the first amplifier (the one used to amplify an input signal to be amplified) has its gain automatically linked to the gain of the second one. And the second amplifier has its output automatically linked to the set value while, at the same time, having a fixed voltage or current as an input signal. It therefore has a known gain proportionate to the set value. Finally, the first amplifier, which is identical to the second one and receives the same gain control signal, thus has a gain proportionate to the set value, which is what was desired.

As a consequence, in practice, the gain control signal of the two controlled gain amplifiers has come from the output of a differential amplifier having one input connected to a voltage or current input with a set value and the other input connected to the output of the second controlled gain amplifier.

There may be a wide manufacturing variation in one manufactured batch of integrated monolithic circuits, but it is known that, on one and the same circuit, it is easy to make two identical amplifiers with a very small variation.

The set value signal may be a current or voltage, and the circuit according to the invention will easily adapted, according to the choice made.

BRIEF DESCRIPTION OF THE DRAWINGS

Other characteristics and advantages of the invention will appear from the following detailed description, made with reference to the appended drawings, wherein:

FIG. 1 is a schematic diagram of the invention;

FIG. 2 is a corresponding diagram in which the signals are processed differentially;

FIG. 3 shows an adaptation of the drawing of FIG. 1, with a set value given in the form of a current;

FIG. 4 shows an detailed diagram of an exemplary embodiment corresponding to FIG. 3.

DESCRIPTION OF PREFERRED EMBODIMENTS

FIG. 1 shows a base circuit according to the invention. It has a controlled gain amplifier 1. This amplifier receives a signal to be amplified at an input (E) of signals to be amplified. It has a gain control input (Eg1), and its gain G is a function of the signal present at the input Eg1. At its output (S), it gives a signal which is the input signal multiplied by the gain G.

As a rule here below, the same reference shall designate, at the same time, an input or an output and the signal present at this input or output.

Thus, the output of the amplifier A1 gives a signal $S = G \cdot E$. The gain G varies as a function of the gain control signal Vg present at the input Eg1, but this variation is non-linear. We can write $G=f(Vg)$, the function $f$ being non-linear.

The circuit has a second controlled gain amplifier A2, identical to the first one and receiving, at its gain control input Eg2, the same gain control signal Vg as the amplifier A1. The amplifiers A1 and A2 are made on the same integrated circuit substrate.

The signal input of the second amplifier is a reference value, in this case a fixed reference voltage Vref. Consequently, it can be written that the output voltage of the second amplifier is $VS2 = G \cdot Vref$, the gain G at a given instant being the same as the gain G of the amplifier A1.

The output of the second amplifier A2 is applied to an input of a differential amplifier AD with high gain which has another input receiving a set gain value signal (signal Vc). The role of this differential amplifier is to compare the output of the second amplifier and the set value signal, and to give a gain control signal which is a function of the difference between the compared signals. This signal is applied to the gain control input of the amplifier A2 (and consequently also to the control input of the amplifier A1).

The differential amplifier AD has a high gain D and the direction in which the differential inputs are connected is such that the automatic control linkage thus set up tends to reduce the difference between the two inputs of the differential amplifier to the minimum. In other words, if the set gain value signal Vc is modified, then the differential amplifier AD will tend to modify the gain of the amplifier A2 accordingly, to bring the output VS2 of A2 to a value as close as possible to the set gain value signal Vc. The gain of the amplifier A1 will follow the same variations in parallel.

As in all automatic control linkages, there will naturally remain an error voltage $e = VS2 - Vc$ between the inputs of the differential amplifier. It will be seen to it that this error voltage is reduced to the minimum in taking its pass-band into account, nonetheless, so as to introduce no risk of oscillation of the loop (this is a standard problem in all automatic control linkages).

In the theoretical case where the gain D is very great, the gain G of the amplifiers A1 and A2 is equal to VS2/Vref, hence to Vc/Vref. It is perfectly linear as compared with the set gain value signal Vc, and is so independently of the fact that it is linear or non-linear as a function of the gain control voltage Vg applied to the gain control inputs.

In practice, it is easy to compute the gain G of the amplifiers A1 and A2 in the non-ideal case where the gain D of the differential amplifier cannot be considered to be almost infinite. This gives the limits of use of the circuit according to the invention. We would have $G = Vc/(Vref + 1/D \cdot K(Vg))$ if $G = K(Vg) \cdot Vg$, namely if $K(Vg)$ represents the non-linearity of the gain G as a function of Vg.

It can be clearly seen in the expression of the gain G as a function of Vc that a function is obtained which is all the more linear as the gain G is great and, more precisely, greater than the product $K(Vg) \cdot Vref$. This product actually represents the ratio between the output voltage of the amplifier A1 or A2 and the voltage Vg applied to its gain control input. It will be generally easy to meet this condition so as to then obtain a linear gain control with a very good approximation.

If it is desired to finely adjust the slope of variation of the gain G as a function of the set gain value signal Vc, an additional amplifier (or an attenuator) AC could be used to produce the signal Vc. The additional amplifier could have a gain adjustable by means of a ratio of resistance values. There will be no problem of stability in view of the fact that the set gain value signal is a control signal with a far smaller pass-band than the signal to be amplified E.

The gain control signal of the circuit then becomes a signal V applied to the amplifier or attenuator AC with gain B to produced a set value signal $Vc = B \cdot V$.

FIG. 2 shows a circuit which is similar to that of FIG. 1 but uses differential amplifiers A1 and A2 (with differential inputs and differential outputs) without changing the principle of operation of the circuit. The two differential outputs of the amplifier A2 are fed into the differential inputs of the amplifier AD, one of these inputs being taken to a set-value potential Vc (for example by the amplifier or attenuator AC).

FIG. 3 shows a circuit similar to that of FIG. 2, but one in which the set-value signal is a current Ic rather than a voltage. Provision has therefore been made for a resistor R1 inserted between one of the two differential outputs of the amplifier A2 and a corresponding input of the differential amplifier AD. This input receives the control current Ic which produces a voltage drop $R1 \cdot Ic$ in the resistor. The other differential output of the amplifier A2 is connected, also through a resistor R2 equal to R1, to the second input of the differential amplifier AD. The resistor R2 has the function of compensating for a voltage drop which could be due, in the resistor R1, not to the current Ic but to an input current consumed by the amplifier AD (assuming then that the currents consumed are the same at both inputs of the amplifier AD, which is true in equilibrium state in the usual structures of differential amplifiers).

FIG. 4 shows an example, in detail, of an embodiment of the invention. This example corresponds precisely to the diagram of FIG. 3. The circuit elements corresponding to the elements of FIG. 3 have been indicated by corresponding references in FIG. 4.

The amplifiers A1 and A2 are very standardly constituted differential amplifiers with two transistors. One of the inputs of each amplifier is grounded. The other input receives a voltage (input signal to be amplified E for A1, reference voltage Vref for A2). The outputs are used in differential mode. The differential output S of the amplifier A2 is the output of the circuit according to the invention. The differential output of the amplifier A2 is fed into the differential input of the differential amplifier AD through two resistors R1 and R2.

The amplifier AD is also a standard differential stage with high gain and high input impedance. It preferably possesses a capacitive reverse feedback by Miller effect (capacitor Cl) to limit the risks of oscillation due to the high gain of the amplifier.

The set value of the gain of the circuit is given by a variable current source IC connected to an input of a differential amplifier AD.

The output of the differential amplifier AD is not taken in differential mode in this example. It is a simple output P. It drives the base of the transistors located in the differential arms of the amplifiers A1 and A2. For the amplifier A1, two transistors (Q27 and Q30) thus have their base controlled by the output of the differential amplifier AD. These transistors are each connected in parallel to a load of one of the two differential arms of A1. This load is formed by a transistor (Q28 for one arm, Q29 for the other) in series with a resistor. For the amplifier A2, the assembly is the same: there are two differential arms, the loads of which are formed by a transistor (Q6 for the first arm, Q6 for the second one), in series with a respective resistor; and the output P of the amplifier AD drives the base of a transistor Q4 in parallel with the load of the first arm and the base of a transistor Q5 in parallel with the load of the second arm.

Depending on the voltage present at the output P of the amplifier AD, the gain of the amplifiers A1 and A2 is modified, since their load is modified.

Finally, it will be noted in FIG. 4 that the bias of the load transistors Q6 and Q7 of A2 and Q28 and Q29 of A1 is fixed by three transistors in series Q8, Q9, Q10, mounted as a diode (collector and base connected).

In one exemplary application where the invention proves to be particularly worthwhile, the current Ic is produced by a cell of transistors mounted in such a way that the current consumed by the cell is directly proportionate to the absolute temperature of the cell. It is possible to make cells such as this, given that the current and voltage characteristics of the transistors depend in a known way on the absolute temperature. We thus have a particularly efficient means to make an amplification stage having a gain that is exactly proportionate to the absolute temperature.

What is claimed is:

1. An amplifier circuit with gain controlled by an electrical set value signal, comprising:
    first and second identical amplifiers each having controllable gain means for controlling respective gains thereof and means for receiving a common gain signal; and
    a differential amplifier having a first input, a second input, and an output for providing the common gain signal;
    wherein the first amplifier has means for receiving an input signal to be amplified and means for providing an amplified output signal;
    wherein the second amplifier has means for receiving a fixed reference signal and means for supplying, at an output of the second amplifier, an output signal proportional to both the fixed reference signal and to the gain of the second amplifier; and
    wherein the amplifier circuit further includes:
    means for providing the output signal from the output of the second amplifier to the first input of the differential amplifier;
    means for providing a signal derived from the set value signal to the second input of the differential amplifier; and
    means for supplying the common gain signal from the output of the differential amplifier to the means for receiving the common gain signal.

2. An amplifier circuit according to claim 1, wherein the first and second amplifiers are made on one and the same integrated circuit substrate.

3. An amplifier circuit according to one of the claims 1 or 2, wherein the set value signal is a temperature dependent electrical signal.

4. An amplifier circuit according to claim 3, wherein the set value signal is proportionate to the absolute temperature.

5. An amplifier circuit according to claim 1, wherein the set value signal is a voltage.

6. An amplifier circuit according to claim 1, wherein the set value signal is a current.

7. An amplifier circuit according to claim 1, wherein the electrical set value signal is applied through an adjustable gain calibration circuit.

8. An amplifier circuit according to claim 1, wherein the first and second amplifiers are amplifiers with two differential outputs, each of the two outputs of the second amplifier being connected through a respective resistor to a respective input of the differential amplifier, and one of the first and second inputs of the differential amplifier being further connected to a set value current source.

* * * * *